United States Patent [19]
Travot et al.

[11] 4,079,429
[45] Mar. 14, 1978

[54] OPTICAL DETECTOR FOR MAGNETIC FIELDS EMPLOYING FEEDBACK CIRCUITRY

[75] Inventors: Guy Claude Daniel Travot, St Maur-des-Fosses; Gerard Rene' Sirand-Rey, Roissy-en-Brie, both of France

[73] Assignee: Eastman Kodak Company, Rochester, N.Y.

[21] Appl. No.: 760,475

[22] Filed: Jan. 18, 1977

[51] Int. Cl.² ............................................... G11B 5/32
[52] U.S. Cl. ................................. 360/114; 350/151; 365/121
[58] Field of Search .................. 360/114; 350/151; 324/43 L, 43 R; 340/174 YC; 356/114

[56] References Cited

U.S. PATENT DOCUMENTS

| | | | |
|---|---|---|---|
| 2,974,561 | 3/1961 | Hardy et al. | 324/43 R X |
| 3,268,879 | 8/1966 | Lins | 360/114 |
| 3,284,785 | 11/1966 | Kornei | 360/114 |
| 3,491,351 | 1/1970 | Smaller et al. | 360/114 |
| 3,721,965 | 3/1973 | Morgan-Voyce | 350/151 X |
| 3,775,570 | 11/1973 | Lewicki et al. | 360/114 |
| 3,947,890 | 3/1976 | Travot et al. | 360/114 |

*Primary Examiner*—John H. Wolff
*Attorney, Agent, or Firm*—Thomas H. Close

[57] ABSTRACT

An optical detector for magnetic fields detects rotations in the polarization of a beam of polarized light caused by the magnetic fields. A modulator responsive to a fixed frequency signal introduces a fixed frequency of oscillation in the polarization of the light beam. The output signal of a polarization detector is filtered by a band pass filter and is fed, along with the fixed frequency signal, to a phase detector. The output of the phase detector is inverted and used as a feed-back signal to the modulator to cancel the rotation in polarization caused by the magnetic field. This feedback signal is also the final output signal of the detector.

7 Claims, 1 Drawing Figure

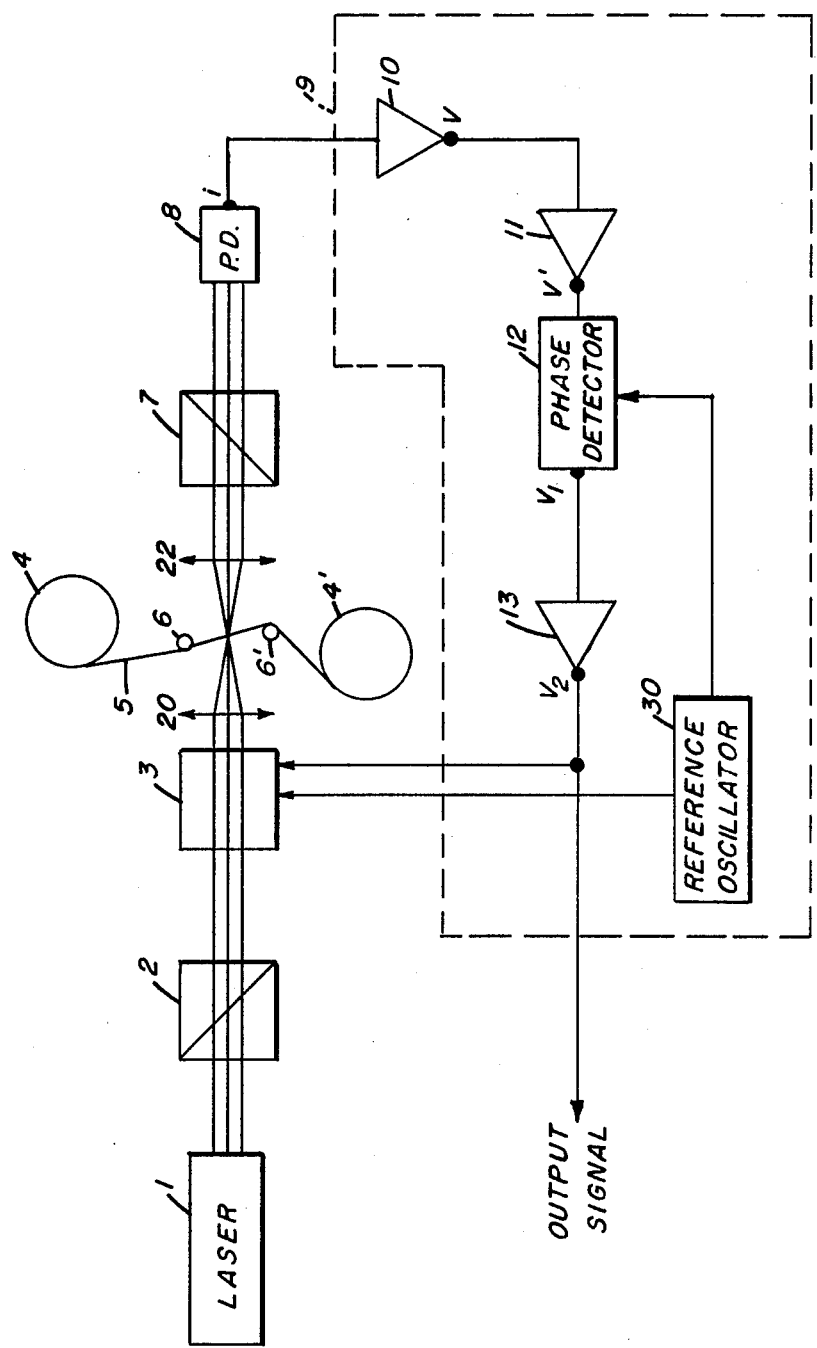

OPTICAL DETECTOR FOR MAGNETIC FIELDS EMPLOYING FEEDBACK CIRCUITRY

BACKGROUND OF THE INVENTION

1. Field of the Invention

The invention relates to optical apparatus for detecting magnetic fields where such detection is based on magnetic rotations to a polarized light beam.

2. Description Relative to the Prior Art

It is well known to detect magnetic fields based on Kerr or Faraday effect rotations to a polarized inspection beam. Unfortunately, such optical detection of magnetic fields, generally recordings, tends to yield an undesirably low signal-to-noise ratio. This is because of the small magnetic rotation angles which are produced and the numerous possibilities for introducing noise when attempting to detect such angles.

In the prior art, regarding optical detection of magnetic recordings, various approaches have been taken to reduce noise levels. It is known, for example, to utilize signal differencing techniques for cancelling certain types of noise. With such techniques the polarized inspection beam is split into two parts and two slightly displaced beam analyzers are employed for detecting rotation angles. By differencing the analyzer outputs, certain of the noise components are caused to cancel whereas a signal representative of beam rotation is retained.

It is also known to oscillate the polarizaton direction of the inspection beam to provide a reference frequency for use in detecting magnetic rotations. U.S. Pat. No. 3,947,890 describes such a technique wherein the degree of assymetry introduced in an output waveform by magnetic rotations serves to indicate the nature of magnetic records. In a preferred implementation of that technique, frequencies around the beam oscillation frequency and the second harmonic thereof are isolated for detecting magnetic rotations.

Notwithstanding these noise reduction techniques it would be desirable to have other approaches for increasing signal-to-noise ratios in an optical detection apparatus.

SUMMARY OF THE INVENTION

An optical detector for a magnetic field, such as the field produced by a magnetic recording, relies upon Kerr or Faraday effect rotations for detection, but in doing so utilizes a feedback circuit for nullifying such rotations. A feedback signal activates a modulator, which is located in the beam path, to produce a cancelling rotation, i.e., a rotation opposing the magnetic rotation, and such feedback signal then serves to indicate the nature of the field which produced the magnetic rotation.

In a presently preferred implementation, the modulator also introduces a fixed frequency oscillation in the direction of beam polarization. An analyzer is arranged to receive the inspection beam and for the presently preferred implementation has its direction of polarizaton at substantially right angles to the polarization direction of the inspection beam.

As is discussed more fully below, it is recognized in the preferred implementations for the invention that the mere presence of a component in the output of the analyzer at the oscillation frequency indicates a magnetic rotation (the periodic beam oscillation itself produces a component in the analyzer output at double the oscillation frequency). By isolating the analyzer output in a narrow frequency band around the oscillation frequency and detecting the phase thereof to indicate the magnetic rotation direction, a feedback signal is produced for nulling such rotation. Such filtering around the oscillator frequency works to remove noise components to a significant degree and has the effect of appreciably enhancing the ratio of signal to noise. As was mentioned above, with such an arrangement according to the invention, it is the feedback signal that then serves to indicate the nature of, say, a magnetic recording on a medium which is passed through the inspection beam.

BRIEF DESCRIPTION OF THE DRAWINGS

The FIGURE is a system diagram partially in block form of apparatus embodying the invention.

DESCRIPTION OF THE PREFERRED EMBODIMENT

Preferred detection apparatus includes a light source 1 cooperating with a polarizer 2 to produce a polarized inspection beam. Such beam propagates along a beam path and is acted upon by an electro-optical modulator 3, a lens 20, a medium such as a magnetic tape 5, a lens 22, an analyzer 7, which is arranged with its polarization direction relative to the beam path being substantially perpendicular to that of the polarizer 2, and a photosensitive receiver 8. The receiver 8 produces an output signal related to the intensity of the beam component transmitted by the analyzer 7 and sends such signal to a feedback circuit 9 which is connected to provide control inputs to the modulator 3.

For the illustrated apparatus arrangement, the tape 5 is substantially transparent and Faraday effect rotations are detected. It will be appreciated, however, that Kerr effect rotations could instead be detected if a reflecting tape were employed. To utilize the Kerr effect the lens 22, the analyzer 7, and the receiver 8 would, of course, be arranged to influence a reflected beam component. Also, while a tape has been indicated as a magnetic medium, other sources of a magnetic field may be employed such as a magnetic disc.

Means is preferably provided for advancing the magnetic tape via guide rollers 6 and 6' through the beam path, and between, for example, supply and takeup reels 4 and 4'. The orientation of the tape in the beam path is selected so that the magnetic records on the tape have a magnetization component in the direction of the polarized inspection beam. Such component them influences the beam by introducing Kerr or Faraday effect rotations.

Now considering the feedback circuit 9 in further detail, an oscillator 30 supplies a signal of a preselected reference frequency (N) to the modular 3. Preferably the frequency N is chosen to be around ten times the highest frequency introduced by the influence of the magnetic medium. In response to such reference frequency signal, the modulator 3 produces an oscillation in the polarization direction of the inspection beam. As the magnetic records on the tape 5 pass through the inspection beam, they have the effect of either retarding or advancing the phase position of the oscillations in the polarization direction produced by the reference frequency signal. Thus, the reference frequency is analogous to a "carrier frequency" and the frequency of rotation introduced by the magnetic medium is analogous to the "modulating frequency" in a phasemodulated type communication system. In such a system, the information represented by the modulating signal appears in side bands about the carrier frequency. For a background discussion of phase modulation, see Terman, F. E. *Electronic and Radio Engineering* N.Y. McGraw-Hill, 1955, Fourth Edition, pp 592–594.

The circuit 9 as implemented, includes a current-to-voltage converter 10 which receives the output (denoted *i*) of the photosensitive receiver 8 and provides a voltage signal (denoted V) to a selective-bandpass amplifier 11, which isolates a signal component (denoted V') having frequencies in a band around the frequency N. Such a signal component represents magnetic rotation of the polarization direction of the beam. By filtering out frequencies above and below the pass-band, fluctuations in the intensity of the inspection beam due to causes other than rotation of the polarization direction of the beam, such as variations in the transmittance or reflectivity of the magnetic medium 5, or variations in the emission of the beam source 1, can be strongly suppressed. This greatly enhances the signal/noise ratio when detecting small magnetic rotations of the polarized beam. The width of the passband is predetermined to include the sideband frequencies introduced by magnetic rotations of the polarization direction caused by the magnetic records on the tape 5. After such bandpass filtering by amplifier 11, the isolated signal component is applied to a phase detector 12 which also receives, as a reference, the output signal of the oscillator 30. The polarity and amplitude of the output signal (denoted $V_1$) from the phase detector 12 changes according to phase relationship of the reference signal to the signal component from selective bandpass amplifier 11. The signal $V_1$ is amplified by an amplifier 13 to produce an output feedback signal (denoted $V_2$) which is applied to the modulator 3. Such feedback signal augments the signal from the reference oscillator 30 and has a polarity (negative feedback) to cause the modulator 3 to drive the polarization direction of the inspection beam toward an orientation for nulling the output of the phase detector 12. The use of a negative feedback loop further suppresses any noise that may be introduced into the output signal by components of the device and thereby further enhances the signal/noise ratio of the output signal. For a background discussion of the use of feedback to suppress output disturbances caused by noise in internal components of a device, see James, Nicholas, and Phillips *Theory of Servomechanisms* N.Y. McGraw-Hill, 1947, p 145.

The output signal of the amplifier 13 is indicative of the rotation produced by the magnetic record and provides an electrical signal representation of the magnetic record on the tape 5. Such signal by virtue of the selective bandpass filtering at amplifier 11 and of the cancelling of the beam rotation has desirable signal-to-noise characteristics.

Now considering particularly a presently preferred embodiment for the invention, the light source 1 is a helium-neon laser and the inspection beam is polarized substantially linearly by the polarizer 2, which is a Glazebrook prism. The modulator 3 consists of a unit formed of a quarter-wave plate (one of the neutral lines of which is parallel to the direction of polarizer 2) and of a Pockels-effect electro-optical modulator, for example, a modulator such as Isomet, Model EOLM, type 400, manufactured by the Isomet Corporation, 103 Bauer Drive, Oakland, New Jersey, U.S.A. The neutral lines of the modulator are shifted 45° from the direction of prism 2. The amplitude of the oscillations produced by the modulator, is preferably on the order of one degree.

The inspection beam is focused by the lens 20 which defines a reading "spot" on the tape 5. A driving mechanism (not shown) moves the magnetic tape through the beam path . . . the tape 5 unwinds from the spool 4 and is rewound onto the spool 4' after having encircled guide rollers 6 and 6' which orient the surface of the tape at an angle to the axis of the beam. The magnetization vector of the magnetic tape (along the longitudinal tape axis) consequently has a component along the axis of the beam, and this component causes a rotation, as a result of the Faraday effect, in the orientation of the plane of polarization of the beam.

The beam after being influenced by the magnetic tape 5 is directed by the lens 22 onto the analyzer 7, preferably a Glazebrook prism and a transmitted component thereof activates the photosensitive receiver 8, a silicon photodiode. The polarization direction of the analyzer 7 is shifted 90° from the polarization direction of the polarizer 2.

As was mentioned above, the operating frequency N of oscillator 30, is preferably selected to be at least 10 times greater than the frequency of the recorded signal. By so selecting the oscillator frequency, the passband of the amplifier 11 may be relatively narrow. For example, in reading magnetic tape at say a rate of 19 centimeters per second, where the tape has a numerical recording of density 3200 bits per inch, the frequency N is preferably at least:

$$10 \times 3200 \times (19/2.54) = 240,000 \text{ Hz}$$

In the presently preferred embodiment of the invention, an oscillator frequency of 1.25 MHz is employed.

The output voltage of amplifier 13 is representative of the magnetic recording and can feed a loud-speaker (not shown) or some other type of utilization device.

The invention has been described in detail with reference to a presently preferred implementation thereof; however, it will be appreciated that various modifications are possible within the spirit and scope of the invention. For example, while preferred application of this invention is in the contactless reading of, say iron oxide-, MnBi-, ferrite-, or garnet-based transparent magnetic tapes, it is also useful in the contactless reading, by means of reflection (Kerr effect), of magnetic recording tapes having a degree of specular reflectance (such as supports coated with a cobalt-phosphor magnetic layer obtained by autocatalytic deposit). Also, the invention may be employed in measuring the beam rotating effect of a test sample of any optically active material.

What is claimed is:

1. An apparatus for detecting the field of a magnetic medium comprising:
   a source of a beam of light having a dominant polarization direction;
   means for positioning the magnetic medium in the path of such beam in an orientation to align a magnetic field component with such beam path, whereby such field component rotates the polarization direction of said beam proportional to the magnitude of said field component;
   sensing means, at a location in the beam path beyond said positioning means, for producing a first signal having a component which is related to the polarization direction of said beam at such location;

modulation means, at a location in the beam path preceding said sensing means, for rotating the polarization direction of said beam in response to a feedback signal; and means responsive to said component of said first signal, for generating said feedback signal, said feedback signal being of a polarity to cause said modulator means to counter the polarization rotations caused by the magnetic field of the medium to said beam, whereby said feedback signal has a component representative of the magnitude of said component of said magnetic field of the magnetic medium.

2. In an apparatus for reading a magnetic record on a medium, such apparatus including:

(1) a source of a linearly polarized beam of light, and in the direction of propagation of the beam, further including:

(2) an electro-optical modulator driven by a periodic, reference signal of predetermined frequency N, (3) apparatus for moving the medium through the beam so that the magnetization vector of the medium has a component along the axis of the beam, (4) a prism-analyzer for receiving the beam after the beam has been influenced by the magnetic record on the medium, and (5) a photosensitive receiver for receiving the beam that is transmitted by the analyzer and for responsively producing a first electrical signal which is a function of the intensity of the beam, the improvement comprising:

an electronic circuit for supplying a feedback signal to said modulator, said circuit including means for receiving said first electrical signal and for isolating a component thereof in a frequency range about the frequency N, phase responsive means for receiving said periodic reference signal and said component of said first electrical signal indicative of the phase relationship between said component of said first electrical signal and said reference signal, and means for applying said feedback signal to said modulator in a negative feedback phase relationship;

whereby said feedback signal has a component representing the magnitude of the component of the magnetization vector of the medium and hence representing said magnetic record.

3. In a device for optically detecting the field of a magnetic medium based on Kerr or Faraday effect rotations to a light beam, said device including a source of a beam of light having a dominant polarization direction, apparatus comprising:

a modulator located in the path of such beam, said modulator having a signal input and being responsive to a control signal being applied to said signal input to cause a rotation of the polarization direction of such a beam proportional to a component of said control signal;

means for positioning such a medium to have a magnetic field component along the beam path to thereby rotate the polarization direction of said beam in proportion to the strength of said field component;

sensing means, at a location in the beam path after said modulator and after said positioning means, for producing an output signal having a component related to the polarization direction of said beam at such location;

an oscillator for producing a periodic reference signal of preselected frequency N;

means for supplying such reference signal as a control signal to said modulator to cause thereby a periodic rotation in the polarization direction of the beam having a frequency N;

a selective bandpass device having a passband range around the frequency N, said selective bandpass device being connected to receive the output signal of said sensing means and to produce a filtered output signal;

a phase detector for receiving the reference signal and the filtered output signal of said selective bandpass device, and for responsively producing a feedback signal having a component representative of the phase relationship of the filtered output signal and the reference signal; and means for supplying the feedback signal to said signal input of said modulator in a negative-feedback phase relationship, whereby such feedback signal represents the strength of the magnetic field component of the medium.

4. Apparatus according to claim 3 wherein said sensing means comprises an analyzer arranged in the beam path with polarization direction at right angles to that of polarization direction of said source and a photosensitive receiver positioned to receive at least a portion of the light transmitted by said analyzer.

5. Apparatus according to claim 4 wherein said selective bandpass device is a bandpass amplifier.

6. In a device for optically detecting a magnetic record on a tape based on Faraday effect rotations to a light beam, said device including a source of a beam of light having a dominant polarization direction, apparatus comprising:

a modulator located in the path of the beam, said modulator having a signal input and being responsive to a control signal being applied to said signal input to cause a rotation of the polarization direction of the beam proportional to a component of said control signal;

means for positioning the tape to have a magnetic field component along the beam path to thereby rotate the polarization direction of said beam in proportion to the strength of said magnetic field component;

sensing means, at a location in the beam path after said modulator and after said positioning means, for producing an output signal having a component related to the polarization direction of said beam at such location;

an oscillator for producing a periodic reference signal of preselected frequency N;

means for supplying such reference signal as a control signal to said signal input of said modulator to cause thereby a periodic rotation in the polarization direction of the beam, such periodic rotation having a frequency N;

a selective bandpass device having a passband range around the frequency N, said selective bandpass device being connected to receive the output signal of said sensing means and to produce a filtered output signal;

a phase detector for receiving the reference signal and the filtered output signal of said selective bandpass device, and for responsively producing a feedback signal having a component representative of the phase relationship of the filtered output signal and the reference signal; and means for supplying the feedback signal to said signal input of said modulator in a negative-feedback phase relationship, whereby such feedback signal represents the strength of the magnetic field component along the beam path.

7. Apparatus according to claim 6 wherein said positioning means includes means for advancing said tape through said beam path and where the tape speed is preselected respective of record characteristics to produce a maximum magnetic rotation frequency which is less than one-tenth the frequency N.

* * * * *